United States Patent
Bellezza et al.

Patent Number: 5,117,269
Date of Patent: May 26, 1992

[54] EPROM MEMORY ARRAY WITH CROSSPOINT CONFIGURATION

[75] Inventors: Orio Bellezza, Curno; Massimo Melanotte, Milan, both of Italy

[73] Assignee: SGS-Thomson Microelectronics S.r.l., Agrate Brianza, Italy

[21] Appl. No.: 487,480

[22] Filed: Mar. 2, 1990

[30] Foreign Application Priority Data

Mar. 9, 1989 [IT] Italy .................. 19697 A/89

[51] Int. Cl.$^5$ .................................. H01L 29/78
[52] U.S. Cl. .................... 357/23.5; 365/185
[58] Field of Search ............ 357/23.15; 365/185

[56] References Cited

U.S. PATENT DOCUMENTS

| | | | |
|---|---|---|---|
| 4,012,446 | 4/1991 | Bergemont | 357/23.5 |
| 4,342,099 | 7/1982 | Kuo | 357/23.5 |
| 4,405,995 | 9/1983 | Shiral et al. | 357/23.5 |
| 4,554,643 | 11/1985 | Kuo | 357/23.5 |
| 4,597,060 | 6/1986 | Mitchell et al. | 357/23.5 |
| 4,622,737 | 11/1986 | Ravaglia | 357/23.5 |
| 4,698,900 | 10/1987 | Esquivel | 357/23.5 |
| 4,853,895 | 8/1989 | Mitchell et al. | 357/23.5 |
| 4,912,676 | 3/1990 | Paterson et al. | 365/185 |
| 4,924,437 | 5/1990 | Paterson et al. | 357/23.5 |
| 4,994,403 | 2/1991 | Gill | 357/23.5 |
| 5,008,721 | 4/1991 | Gill et al. | 357/23.5 |
| 5,011,787 | 4/1991 | Jeuch | 357/23.5 |

FOREIGN PATENT DOCUMENTS

| | | | |
|---|---|---|---|
| 0282137 | 9/1988 | European Pat. Off. | 365/185 |
| 54-156483 | 12/1979 | Japan | 357/23.5 |
| 54-156484 | 12/1979 | Japan | 357/23.5 |
| 57-102073 | 6/1982 | Japan | 357/23.5 |
| 61-30063 | 2/1986 | Japan | 357/23.5 |

*Primary Examiner*—Rolf Hille
*Assistant Examiner*—Steven Loke
*Attorney, Agent, or Firm*—Townsend and Townsend

[57] ABSTRACT

In order to obtain an EPROM memory array with high compactness and the possibility of asymmetrically doping the channel, an array is proposed which comprises a substrate having a first conductivity type, first and second bit lines having the opposite conductivity type and extending parallel and mutually alternated in the substrate, a plurality of thick insulating material regions extending at least partially in the substrate above and parallel to the first bit lines, a plurality of floating gate regions extending above the substrate perpendicular to and between adjacent pairs of bit lines, a plurality of word lines extending perpendicular to the bit lines and above, but electrically insulated from, the floating gate regions, wherein the second bit lines extend up to the surface of the substrate and define unburied bit lines to the side whereof it is possible to provide enriched channel regions. The unburied bit lines can furthermore be subjected to a siliciding process to reduce series resistance.

13 Claims, 3 Drawing Sheets

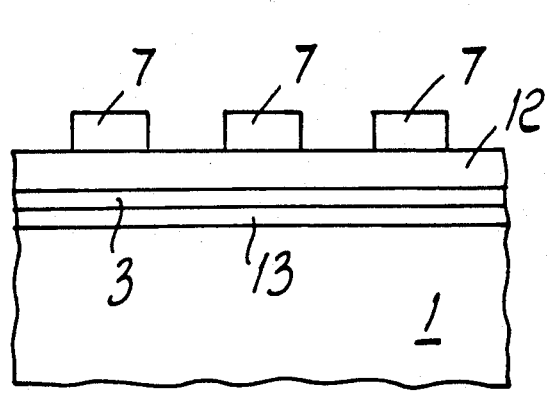
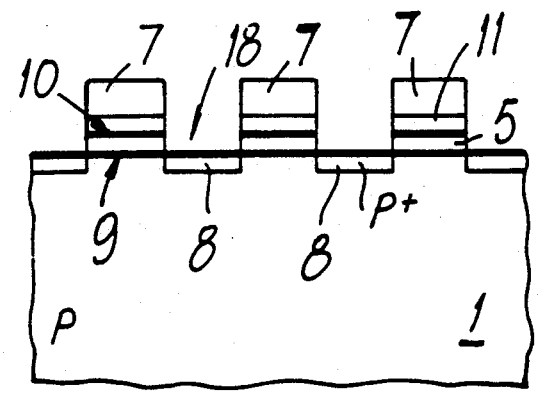
Fig. 4    Fig. 5
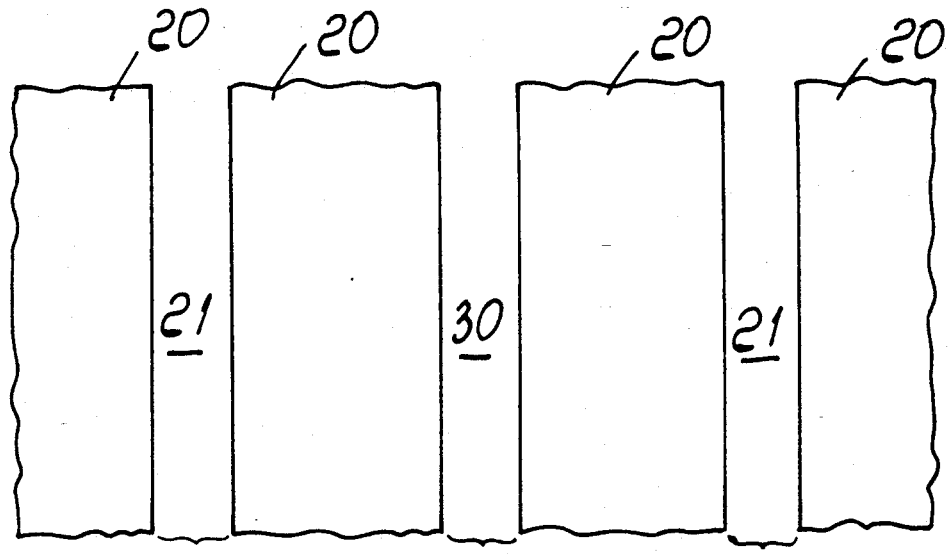
Fig. 11
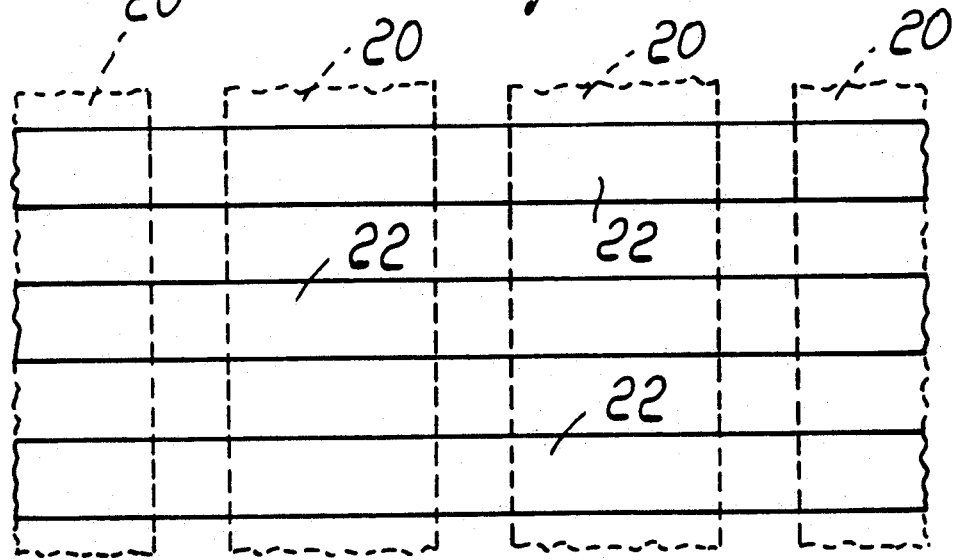
Fig. 12

EPROM MEMORY ARRAY WITH CROSSPOINT CONFIGURATION

BACKGROUND OF THE INVENTION

The present invention relates to an EPROM memory array with crosspoint configuration and to a method for its manufacture.

As is known, EPROM arrays with crosspoint configuration have source and drain lines which define the bit lines, extend mutually parallel and alternated and are perpendicular to the word lines defined by gate lines.

It is also known that in EPROM cells it is necessary to make two requirements coexist: on one hand, to have a high read current to optimize the speed of the cell, on the other to have a structure which allows sufficient multiplication and therefore ensures a good writing efficiency of the cell.

These requirements are mutually opposite, since the first condition is favored by low channel doping levels, whereas the second requires high doping levels in the channel proximate to the drain junction. A doping level which provides the best compromise between these two requirements is therefore usually adopted.

A better solution consists in doping the channel more heavily only on the drain side. This higher doping does not reflect in a decrease of the read current, since the affected region, being proximate to the drain junction, depletes during reading. Furthermore, in the case of cells with asymmetrical doping, it is also possible to invert the source and the drain during reading and writing, using, as the drain, the more heavy doped side during writing and the less doped side during reading, so as to minimize unwanted writing of unselected cells (so-called "soft writing").

Cells with asymmetrical dopings of this kind have been manufactured using a mask which is aligned with the center line of the gate, covering the side toward the source and leaving open the channel toward the drain. However, as the size decreases it becomes extremely critical to align a mask on a gate the width whereof can be less then $0.8\mu$.

Conventional EPROM cells furthermore have the disadvantage of not allowing size reduction due to the criticalities caused by the small size of the contacts, by the difficulties in shaping complex cell geometries with overlapping gates and by the high density of the contacts.

In order to solve this problem, a structure has already been proposed (see the article "High Density Contactless, Self Aligned EPROM Cell Array Technology", J. Esquivel et al., IEEE, 1986, pages 592-995) with bit lines buried under a thick oxide grown with a local oxidation method, so that the memory cell is symmetrical with respect to the source and drain diffusions. This structure advantageously solves the problem of reducing the array size, allowing an area saving of up to 33% with respect to the preceding conventional solutions, but does not allow the asymmetrical doping of the drain lines with respect to the source ones and therefore does not provide optimum results as regards the electric characteristics of the memory array.

SUMMARY OF THE INVENTION

Given this situation, the aim of the present invention is to provide an EPROM memory array with crosspoint configuration and a method for its manufacture which solve the disadvantages of the prior art and in particular offers the possibility of asymmetrically doping the drain lines with respect to the source lines, with a structure which has a reduced bulk which can be compared to, or is even smaller than, the bulk of the known structure with buried bit lines.

Within this aim, a particular object of the present invention is to provide a memory array and a method for its manufacture so that the array obtained has improved electric characteristics and in particular has the possibility of reducing the series resistance of the drain line.

Another object of the present invention is to provide a memory array and a method for its manufacture which do not entail complicated or in any way critical method steps in view of the extremely small sizes currently required.

Not least object of the present invention is to provide a memory array and a method for its manufacture which entail per se already known method steps such as to allow the use of machines commonly used in the electronics industry, with easily controllable procedures and results.

This aim, the objects mentioned and others which will become apparent hereinafter are achieved by an EPROM memory array with crosspoint configuration and by a method for its manufacture, as defined in the accompanying claims.

BRIEF DESCRIPTION OF THE DRAWINGS

The characteristics and advantages of the invention will become apparent from the description of a preferred but not exclusive embodiment, illustrated only by way of non-limitative example in the accompanying drawings, wherein:

FIGS. 2 to 5 are transverse sectional views across the array of FIG. 1, taken along the lines II—II, III—III, IV—IV and V—V respectively;

FIGS. 11 and 12 are plan views of two masks used for the manufacture of the memory array according to the invention.

DESCRIPTION OF THE PREFERRED EMBODIMENTS

Figure 1:
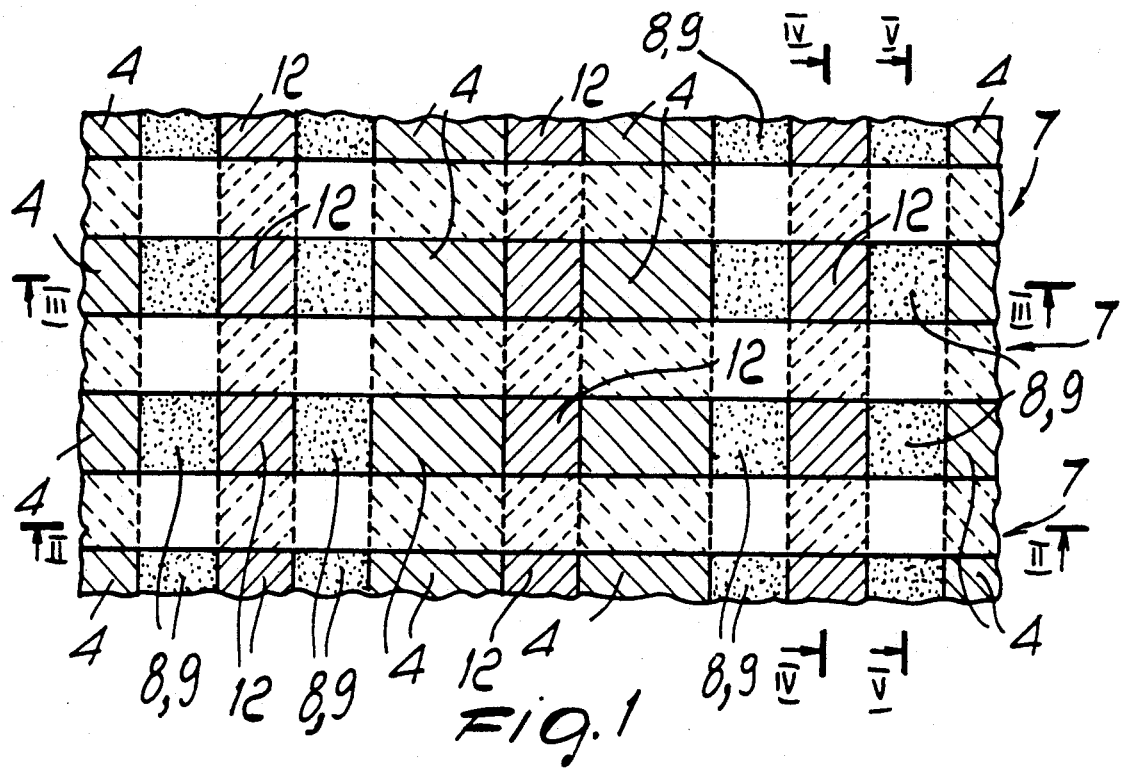
FIG. 1 is a top view of the memory array according to the invention.
Figure 2:
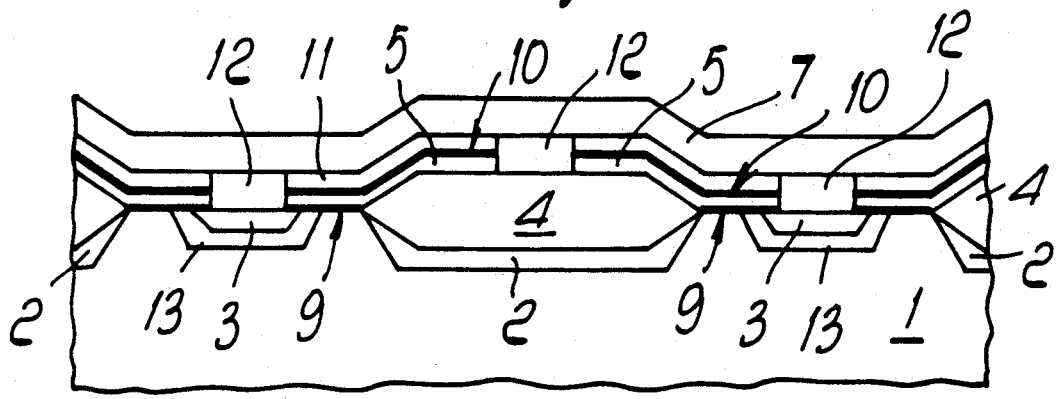
Figure 3:
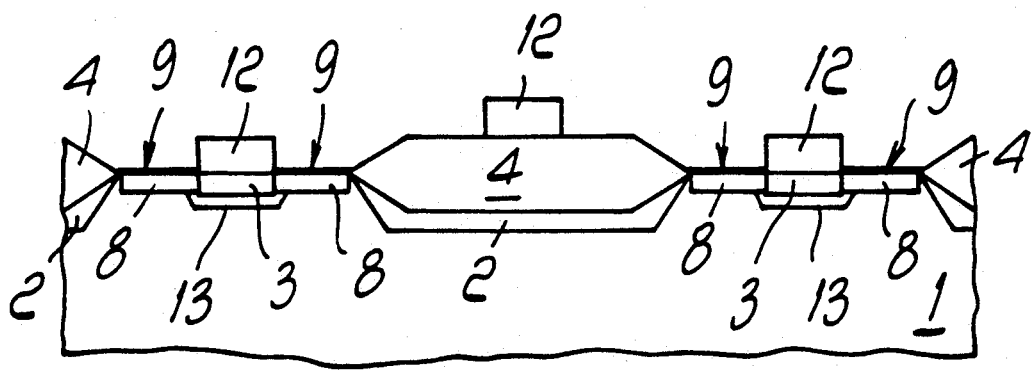

Reference is initially made to FIGS. 1 to 5, which illustrate the structure of the memory array according to the invention before the final steps for obtaining the insulating protective layer, the electric connections and the contacts.

As can be seen, the memory array according to the invention comprises, in a semiconductor substrate 1, for example of the P type, bit lines 2 and 3 which are mutually parallel and alternated and have N-type conductivity. In detail, the lines 2, which usually constitute source lines, are buried under a thick thermal oxide layer 4, whereas the lines 3, which usually constitute the drain lines, are arranged facing the upper main surface 18 of the substrate 1 (FIG. 5). Floating gate areas 5 extend in a checkerboard-like manner above the surface 18 at regions thereof extending between and partially overlapping the bit lines 2 and 3 and the thick oxide 4, and are electrically separated from the unburied bit lines 3 by a thin gate oxide layer 9, indicated by thick lines in the figures. Control gate lines 7 extend mutually parallel and perpendicular to the bit lines 2 and 3. Said control gate lines, which define word lines, are superimposed to and are aligned with the floating gate electrode regions 5 through a thin interpoly dielectric layer 10 (indicated with thick lines in the figure) and a "barrier" polysilicon layer 11. The structure furthermore comprises $P^+$-type implanted regions 8 in the substrate zone laterally delimited by the bit lines 2 and 3 and by the word lines 7, in order to ensure isolation between the bit lines. The figure also shows the $P^+$-type enriched regions 13 which extend in the substrate 1 and surround the unburied bit lines 3, so as to more heavily dope the channel (substrate region comprised between the lines 2 and 3 of FIG. 2) proximate to the drain or unburied bit line 3. The figure finally shows the insulation regions 12, constituted by a dielectric layer, which mutually separate the floating-gate areas electrode regions 5 which belong to the different memory cells.

It should be noted that in FIG. 1, for a greater understanding of the structure, the thick oxide regions 4 have been indicated with negative-inclination lines (which are solid in the array zones in which said oxide regions are in view and are broken in the zones where they are covered by the control gate strips 7), the dielectric regions 12 separating the floating gates 5 have been indicated by positive-inclination lines (in this case, too, solid or broken depending on whether they are in view or not), whereas the isolation regions 8 arranged between the word and bit lines (and covered by the thin layer 9) have been indicated by stippling.

In practice, as can be clearly deduced from the drawing, only one of the two bit lines 2 and 3, i.e. the line 2, is buried under a thick oxide, whereas the other line 3 faces the surface of the substrate. In this manner it is possible to obtain asymmetrical source and drain diffusions, thus allowing different dopings in the channel side facing toward the drain with respect to the source side. This structure therefore allows to obtain a good writing efficiency though it maintains a high cell speed.

The unburied implementation of the bit line 3 is advantageous also for another reason, which is related to the possibility of siliciding said line (by virtue of a bond between the silicon and refractory metals, thereby forming silicide in a per se known manner) so as to reduce the series resistance of said bit line.

The illustrated structure requires the decoding type which is typical of arrays with crosspoint configuration, known as virtual ground decoding.

An example of method for manufacturing the memory array according to the invention is described hereafter with reference to FIGS. 6 to 12.

Figure 6:
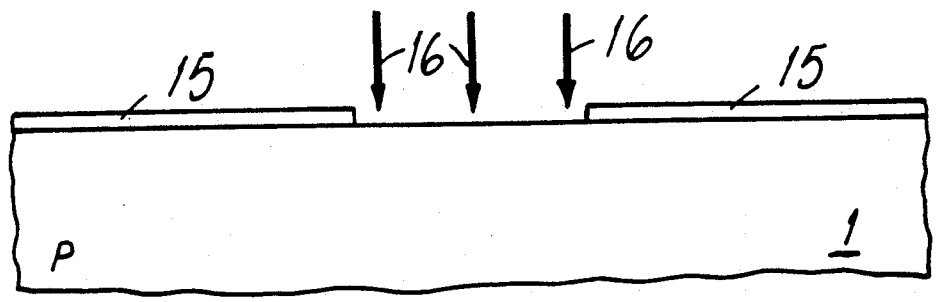
FIGS. 6 to 10 are transverse sectional views, taken at the line II—II, across a silicon wafer in which the array according to the invention is formed, in successive manufacture steps.
Figure 7:
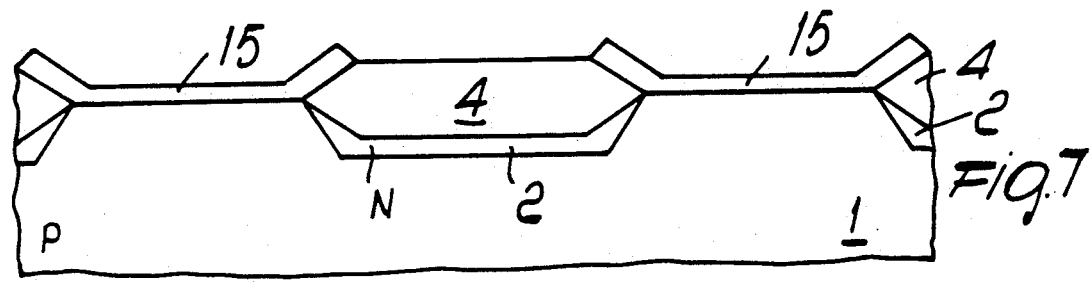

According to the present example, the starting material is a substrate or body 1 of semiconductor material, typically silicon, with P-type conductivity or doping. A thermal oxide with a thickness comprised between 50 and 300 Å is grown thereon, and silicon nitride with a thickness comprised between 800 and 3000 Å is subsequently deposited, obtaining the layer illustrated in FIG. 6 and indicated by the reference numeral 15. The lithographic definition of the active area mask and an anisotropic nitride etching are then performed to obtain windows at the regions in which the buried bit lines are to be provided. An N-type implant is then performed (as indicated in FIG. 6 by the arrows 16) for diffusing the buried bit lines. A thermal treatment is then performed for growing thick oxide bars in the windows opened in the nitride. The structure of FIG. 7, showing the region 2 which defines the buried bit line and the oxide region 4 with a thickness comprised between 1000 and 5000 Å, is thus obtained.

Figure 8:
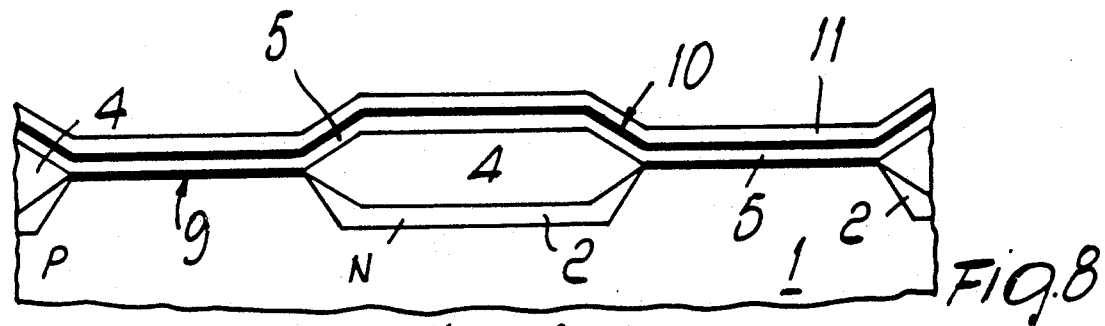

The nitride 15 is then removed with conventional techniques and a thin gate oxide layer, with a thickness comprised between 100 and 300 Å, illustrated with a thick line in FIG. 8 and indicated by the reference numeral 9, is grown. A first polysilicon layer 5, intended to define the floating gates, with a thickness comprised between 1000 and 3000 Å, is then deposited and subsequently doped with N-type ions. A thin interpoly dielectric layer is then deposited or grown with a thickness comprised between 100 and 300 Å. Said layer is illustrated by the thick line 10 in the figure and can be constituted by oxide or so-called ONO (i.e. silicon oxide-silicon nitride-silicon oxide). A "barrier" polysilicon layer, indicated at 11 in FIG. 8, with a thickness comprised between 500 and 3000 Å, is then deposited. At this point the structure is the one shown in FIG. 8.

The floating gate mask, which has the plan structure shown in FIG. 11, is then defined by photolithographic techniques. In said figure, the areas 20 correspond to the regions of the layer 5 which must not be removed and which are intended to form the floating gate regions and the regions interposed between the floating gates of different words (these latter regions being subsequently removed through the control gate mask). The areas indicated at 21 and 30, comprised between the areas 20, are intended to delimit the portions of layer 5 to be removed in order to separate the floating gates of adjacent cells. Furthermore the areas 21, not extending over the oxide region 4, also define the pattern of the unburied bit lines.

Figure 9:
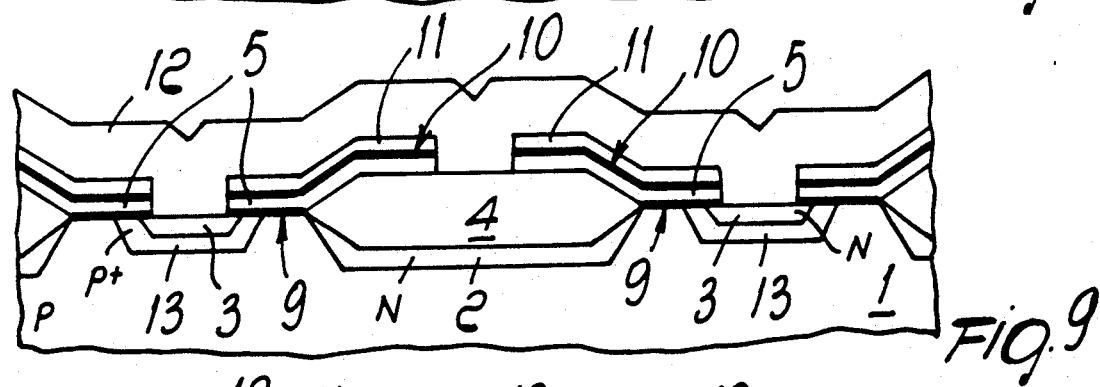

Using this mask, the barrier polysilicon 11, the interpoly dielectric 10 and the first polysilicon 5 are anisotropically etched and P-type determining impurities (typically boron) are implanted for enriching the channel proximate to the drain regions (see region 13 of FIG. 9). Then, if required, siliciding of the uncovered surface of the substrate (siliciding of the unburied bit line) is performed by means of per se known techniques, and an N-type arsenic implant is then performed to diffuse the unburied bit lines (forming the regions 3 after diffusion, as illustrated in FIG. 9). A dielectric layer 12 (e.g. TEOS, tetraethylorthosilicate) with a thickness comprised between 3000 and 10000 Å is then deposited, obtaining the structure illustrated in FIG. 9.

Figure 10:
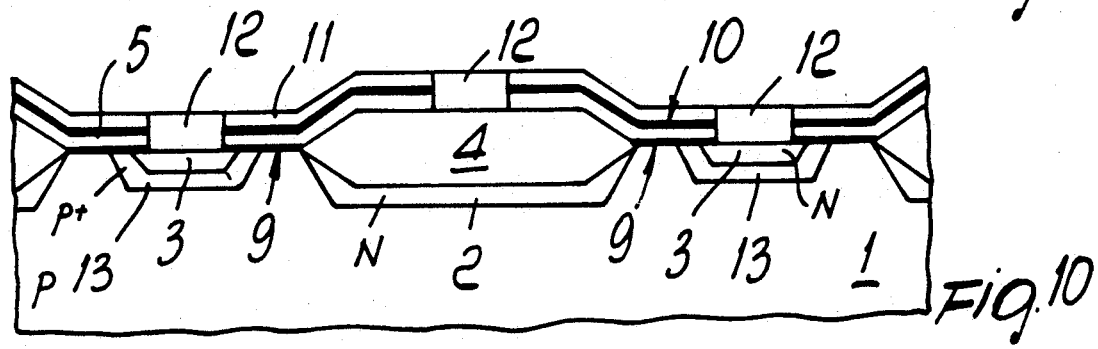

The dielectric layer is then planarized until the layer 11 is uncovered by means of any of the known planarization techniques (e.g. by etch back, i.e. chemical-physical plasma etching of materials deposited by spinning or centrifugation), obtaining the structure of FIG. 10. During the planarization process, said barrier polysilicon layer 11 is performing a protective function with respect to said dielectric layer 10.

A second polysilicon or polysilicide layer (the latter being a double layer of polysilicon and silicide) or an interconnection silicide defining the control gate layer 7 is then deposited with a thickness comprises between 2000 and 6000 Å. The control gate mask (word lines), having the profile illustrated in FIG. 12, in which the areas 22 correspond to the regions of the layer 7 which define the word lines, is then defined photolithographically. This figure also illustrates, in broken lines, the floating gate mask to point out the relative position. The layer 7, the barrier polysilicon 11, the interpoly dielectric 10 and the first polysilicon layer 5 are then selectively etched to uncover portions of the thick oxide 4, of the dielectric 12 and of the gate oxide 9, thus end shaping the floating gates 5 and the control gate lines 7 (word lines). Finally, P-type isolation is implanted in the substrate to obtain the isolation regions 8. The structure shown in FIGS. 1-5 and already described is thus obtained.

The method then continues with conventional steps for manufacturing the array, which comprise, i.a., deposition and shaping of interconnections and contacts and covering with insulating protection layers.

As can be seen from the preceding description, the described embodiment achieves the intended aim and objects. A memory array has in fact been provided in which it is possible to asymmetrically dope the channel with a cell area which is smaller than, or equal to, the one proposed by the above mentioned article for equal design rules and equal technologies used. The structure of the proposed array does not require critical method steps for its manufacture since due to its intrinsic asymmetry it allows the channel to be doped at the drain facing part differently from the source facing part without having to use masks. In fact, after growing the thick oxide which overlies the buried bit line and after defining the floating gate, it is possible, as illustrated above, to perform a boron implant which increases the channel concentration only on the drain facing part.

Said boron implant is self-aligned with respect to the unburied bit line, exploiting the floating gate mask, thus providing high accuracy with no increase in the number of method steps.

The possibility of performing siliciding of one of the two bit lines, thus decreasing its series resistance, is furthermore advantageous.

The invention thus conceived is susceptible to numerous modifications and variations, all of which are within the scope of the inventive concept. In particular, the fact is stressed that though, in the description, the bit line buried under the thick oxide has been assumed to define the source line and the unburied one has been assumed to define the drain, if a greater implant of the channel at the drain facing side is not desired, the cell is perfectly symmetrical with respect to source and drain, and they can be mutually inverted if required. In this case, there is still the advantageous possibility of siliciding the unburied line, be it the drain or source.

Even in the case of asymmetrical doping, the source and drain lines can furthermore be mutually inverted in writing and reading, as explained above, to minimize soft writing.

All the details may finally be replaced with other technically equivalent ones.

We claim:

1. A crosspoint configuration EPROM cell array in a semiconductor substrate of a first conductivity having a surface, said array comprising
   a plurality of first and second conducting regions of a second conductivity in said substrate surface, said first and second conducting regions extending parallel and alternately to each other in a first direction;
   a plurality of relatively thick insulating regions on said substrate surface and said first conducting regions, said relatively thick insulating regions extending substantially coextensively with said first conducting regions;
   relatively thin insulating regions on said substrate surface and extending parallel to said relatively thick insulating regions in said first direction and extending from said relatively thick insulating layer to at least over substantial portions of peripheries of said second conducting regions in a second direction perpendicular to said first direction;
   a plurality of word lines over said relatively thick and thin insulating layers, said word lines extending parallel to each other in said second direction;
   each memory cell of said array having a floating gate region on said relatively thin insulating layer and under one of said word lines, said floating gate region extending from over a periphery of one of said second conducting regions onto one of said relatively thick insulating layers in said second direction and coextensively with said word line in said first direction.

2. The crosspoint configuration EPROM cell array of claim 1 wherein said floating gate region is coextensive with said relatively thin insulating layer over said periphery of said one second conducting region in said second direction.

3. The crosspoint configuration EPROM cell array of claim 1 further comprising a plurality of third regions in substrate and extending to said substrate surface, said third regions of said first conductivity and having a greater dopant concentration than that of said substrate, each third region extending coextensively with one of said second conducting regions in said first direction and surrounding said one second conducting region.

4. The crosspoint configuration EPROM cell array of claim 3 wherein said third regions extend to said substrate surface between said first and second conducting regions, said third regions under said floating gate regions extending only partially across said substrate surface between said first and second conducting regions in said second direction.

5. The crosspoint configuration EPROM cell array of claim 4 wherein said third regions not under said floating gate regions extending completely across said substrate surface between said first and second conducting regions in said second direction.

6. The crosspoint configuration EPROM cell array of claim 1 wherein said first, second conducting and word line regions are substantially stripe-shaped.

7. The crosspoint configuration EPROM cell array of claim 1 wherein said relatively thick insulating region is from 1000 to 5000 Angstroms thick and said relatively thin insulating region is from 100 to 300 Angstroms thick.

8. The crosspoint configuration EPROM cell array of claim 1 further comprising a plurality of first insulating regions, each first insulating region on one of said relatively thick insulating regions under said word lines and extending parallel to said relatively thick insulating regions in said first direction, each first insulating region separating said floating gate regions extending onto said one relatively thick insulating region in said second direction.

9. The crosspoint configuration EPROM cell array of claim 8 further comprising a plurality of second insulating regions, each second insulating region on said substrate surface and extending coextensively over one of said second conducting regions in said first direction, each second insulating region separating said floating gate regions extending over peripheries of said one second conducting region in said second direction.

10. The crosspoint configuration EPROM cell array of claim 1 further comprising a plurality of second insulating regions, each second insulating region on said substrate surface and extending coextensively over one of said second conducting regions in said first direction, each second insulating region separating said floating gate regions extending over peripheries of said one second conducting region in said second direction.

11. The crosspoint configuration EPROM cell array of claim 1 further comprising a plurality of barrier regions over said floating gate regions and under said word line regions, said barrier regions extending coextensively with said floating gate regions.

12. The crosspoint configuration EPROM cell array of claim 11 further comprising a plurality of insulating regions between said floating gate regions and said barrier regions, said insulating regions extending coextensively with said floating gate regions and said barrier regions.

13. The crosspoint configuration EPROM cell array of claim 11 wherein said barrier layers have top surfaces, and said array further comprises a plurality of first insulating regions, each first insulating region on one of said relatively thick insulating regions under said word lines and extending parallel to said relatively thick insulating regions in said first direction, each first insulating region separating said floating gate regions and said barrier regions extending onto said one relatively thick insulating region in said second direction, each first insulating region having a top surface substantially level with said top surfaces of coextensive barrier surfaces extending onto said one relatively thick insulating region in said second direction; and a plurality of second insulating regions, each second insulating region on said substrate surface and extending coextensively over one of said second conducting regions in said first direction, each second insulating region separating said floating gate regions and said coextensive barrier regions extending over peripheries of said one second conducting region in said second direction, each second insulating region having a top surface substantially level with said top surfaces of coextensive barrier surfaces extending over peripheries of said one second conducting region in said second direction.

* * * * *